United States Patent
Tatsumi et al.

(10) Patent No.: US 7,095,998 B2
(45) Date of Patent: Aug. 22, 2006

(54) MIXER AND CONVERTER USING SAME

(75) Inventors: Ryo Tatsumi, Omihachiman (JP); Mitsuhiro Matsumoto, Shiga-ken (JP); Tomoya Bando, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 496 days.

(21) Appl. No.: 10/066,715

(22) Filed: Feb. 6, 2002

(65) Prior Publication Data

US 2002/0126019 A1 Sep. 12, 2002

(30) Foreign Application Priority Data

Mar. 8, 2001 (JP) ............................. 2001-065286
Aug. 21, 2001 (JP) ............................. 2001-250631

(51) Int. Cl.
*H04B 1/26* (2006.01)

(52) U.S. Cl. .................... 455/330; 455/313; 455/326
(58) Field of Classification Search ............... 455/313, 455/325, 326, 327, 330, 323, 318, 319, 333; 716/1–18; 326/101, 102, 103; 307/529, 282; 333/100, 101, 117, 118, 129, 131
See application file for complete search history.

(56) References Cited

U.S. PATENT DOCUMENTS

| 4,340,975 A | * | 7/1982 | Onishi et al. ............... 455/315 |
| 4,651,344 A | * | 3/1987 | Hasegawa et al. .......... 455/325 |
| 4,864,644 A | * | 9/1989 | Takahashi et al. .......... 455/326 |
| 5,265,266 A | * | 11/1993 | Trinh ........................ 455/326 |
| 5,266,963 A | * | 11/1993 | Carter ....................... 343/850 |
| 5,465,416 A | * | 11/1995 | Yanagimoto ................ 455/327 |
| 5,774,801 A | * | 6/1998 | Li et al. ..................... 455/326 |
| 6,456,836 B1 | * | 9/2002 | Nakajima et al. ........... 455/319 |
| 6,483,355 B1 | * | 11/2002 | Lee et al. ................... 327/113 |

FOREIGN PATENT DOCUMENTS

| JP | 08-116218 | 5/1996 |
| JP | 10-276011 A | 10/1998 |
| JP | 2001-292014 A | 10/2001 |

* cited by examiner

*Primary Examiner*—George Eng
*Assistant Examiner*—Sam Bhattacharya
(74) *Attorney, Agent, or Firm*—Keating & Bennett, LLP

(57) ABSTRACT

A mixer, which is a single balanced mixer, includes an LO port for inputting an LO signal, an RF port for inputting an RF signal, an IF port for outputting an IF signal, a balun for converting an unbalanced signal into a balanced signal, and a pair of mixer diodes connected in series. The mixer further includes a high-pass filter for blocking LO and IF signals and passing an RF signal and a low-pass filter for blocking LO and RF signals and passing an IF signal.

17 Claims, 6 Drawing Sheets

MIXER AND CONVERTER USING SAME

BACKGROUND OF THE INVENTION

1. Field of the Invention

The present invention relates to a mixer and a converter including a mixer. More specifically, the present invention relates to a mixer used for converting frequencies from an RF signal to an IF signal and a converter including such a mixer in a communication apparatus or other apparatus utilizing a microwave band.

2. Description of the Related Art

In the past, in radio communication apparatuses, a mixer which mixes an RF (radio frequency) signal and an LO (local oscillation) signal has been used to generate an IF (intermediate frequency) signal that is easier to be processed in a circuit at the subsequent stage. As such a mixer, typically, a single balanced mixer or double balanced mixer which can efficiently reduce the leakage of an LO signal toward the output with a simplified circuit configuration is widely used.

FIG. 7 is a circuit diagram of a typical single balanced mixer. A single balanced mixer 50 includes an LO port 51, an RF port 52 for inputting an RF signal, an IF port 53 for outputting an IF signal, a balun 54 for converting an unbalanced signal to a balanced signal, and mixer diodes 55 and 56. The single balanced mixer 50 further includes a high-pass filter 57 for blocking LO and IF signals and for passing only an RF signal and a low-pass filter 58 for blocking LO and RF signals and for passing only an IF signal. An LO signal input from the LO port 51 is converted by the balun 54 into a balanced signal. The balanced signal is then applied to the node between the balun 54 and the mixer diode 55 and to the node between the balun 54 and the mixer diode 56, thereby driving the mixer diodes 55 and 56. An RF signal input from the RF port 52 passes through the high-pass filter 57 and is applied to the mixer diodes 55 and 56, while an IF signal generated by the mixer diodes 55 and 56 passes through the low-pass filter 58 and is output from the IF port 53.

In general, when such a single balanced mixer 50 is used for the microwave band, for example, a mixer (not shown) of the type in which the balun 54 includes microstrip lines in the same plane of a substrate is used.

According to the mixer 50 of the related art, while it is possible to provide a planarized circuit by forming the balun 54 with microstrip lines, there is a problem in that the balun takes up space and is not suitable for miniaturization because of its shape and size.

SUMMARY OF THE INVENTION

In order to overcome the problems described above, preferred embodiments of the present invention provide a mixer that is miniaturized and prevents degradation of its characteristics, as well as providing a converter including the novel mixer.

According to a preferred embodiment of the present invention, a mixer includes a balun having two balanced lines each having a first end that is short-circuited and a second end that functions as a balanced terminal, and an unbalanced line having a first end that is free and a second end that functions as an unbalanced terminal. The mixer further includes a pair of mixer diodes connected to the respective balanced terminals, an LO port connected to the unbalanced terminal, a high-pass filter, an RF port connected to a node between the mixer diodes through the high-pass filter, a low-pass filter, and an IF port connected to the node between the mixer diodes through the low-pass filter. The balun, the mixer diodes, the high-pass filter, and the low-pass filter are integrated into a multilayer substrate that includes a plurality of sheet layers that is stacked. The multilayer substrate has first external terminals that respectively function as the LO port, the RF port, and the IF port at the side surfaces thereof, and has second external terminals that function as ground. At least one of the second external terminals is arranged between two of the first external terminals.

Preferably, the balanced lines and the unbalanced line are each defined by strip line electrodes, and are arranged in the lower section of the multilayer substrate with respect to the stacking direction thereof.

Preferably, the high-pass filter or the low-pass filter includes at least one capacitor, each capacitor preferably including at least one capacitor electrode, and is arranged in the upper section of the multilayer substrate with respect to the stacking direction. A ground electrode is provided between the at least one capacitor electrode and the strip line electrodes.

According to another preferred embodiment of the present invention, a converter includes the mixer according to the preferred embodiment described above, an RF amplifying unit connected to the RF port of the mixer, a PLL oscillation unit connected to the LO port of the mixer, and an intermediate frequency amplifying unit connected to the IF port of the mixer.

According to the mixer of the preferred embodiment described above, the external terminals which function as the LO port, RF port, and IF port are preferably disposed at the side surfaces of the multilayer ceramic substrate, with external electrodes that function as the ground being provided therebetween. Thus, interference among the external terminals which define the LO port, RF port, and IF port is minimized, so that the loss in the mixer is greatly decreased.

In addition, the balun, mixer diodes, high-pass filter, and low-pass filter which constitute the mixer are integrated into the multilayer substrate that includes a plurality of sheet layers which are stacked on each other, thus allowing miniaturization of the mixer.

Furthermore, the balanced and the unbalanced lines that constitute the balun are provided in the lower section of the multilayer substrate with respect to the stacking direction thereof. Thus, the distance of the balanced and the unbalanced lines from ground is greatly reduced, so that parasitic inductance in the ground plane is minimized. Consequently, it is possible to bring the phase difference between the balanced lines and the unbalanced line closer to a more ideal value.

In addition, the capacitor which defines the low-pass filter is arranged in the upper section of the multilayer substrate with respect to the stacking direction, with the ground electrode being provided between the capacitor and the strip line electrodes that constitute the balanced and unbalanced lines of the balun. Thus, the capacitor is located spaced away from ground provided in the lower section of the multilayer substrate. As a result, stray capacitance is minimized and thus, the isolation is improved.

Since the receiving converter described above has a mixer that achieves a very significant reduction in loss, it can also minimize the loss in the converter.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to the accompanied drawings.

Figure 1:
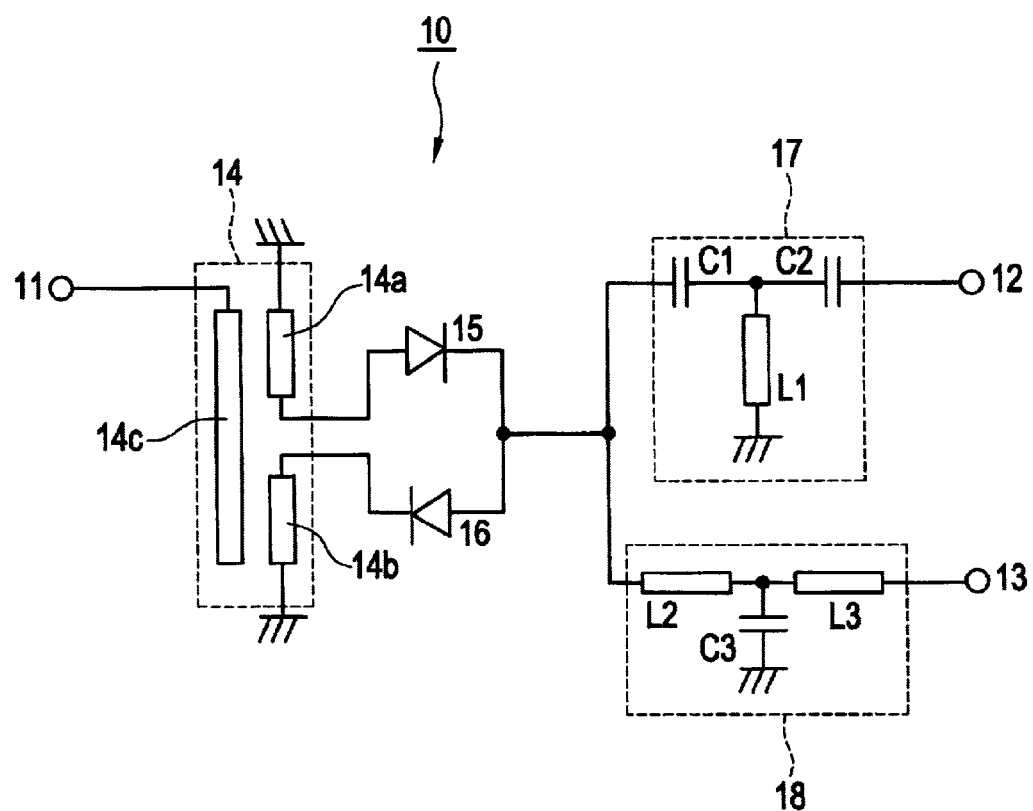
FIG. 1 is a circuit diagram of a mixer according to a preferred embodiment of the present invention.

FIG. 1 is a circuit diagram of a mixer according to a preferred embodiment of the present invention. A mixer 10 is preferably a single balanced mixer, which includes an LO port 11 for inputting an LO signal, an RF port 12 for inputting an RF signal, an IF port 13 for outputting an IF signal, a balun 14 for converting an unbalanced signal into a balanced signal, and a pair of mixer diodes 15 and 16 which are connected in series. The mixer 10 further includes a high-pass filter 17 for blocking LO and IF signals and for passing only an RF signal and a low-pass filter 18 for blocking LO and RF signals and for passing only an IF signal.

The balun 14 includes balanced lines 14a and 14b and an unbalanced line 14c. The balanced lines 14a and 14b each have a first end that is short-circuited. The second end of the balanced line 14a, which end functions as a balanced terminal, is connected to the anode of the mixer diode 15, while the second end of the balanced line 14b, which end functions as a balanced terminal, is connected to the cathode of the mixer diode 16. The unbalanced line 14c has a first end that is free, and a second end, which functions as an unbalanced terminal, of the unbalanced line 14c is connected to the LO port 11.

The high-pass filter 17 preferably includes an inductor L1 and capacitors C1 and C2. The capacitors C1 and C2 are connected in series, and the node therebetween is connected to ground through the inductor L1. The capacitor C1 is connected to the node between the pair of mixer diodes 15 and 16, and the capacitor C2 is connected to the RF port 12.

The low-pass filter 18 preferably includes inductors L2 and L3 and a capacitor C3. The inductors L2 and L3 are connected in series, the node therebetween is connected to ground through the capacitor C3. The inductor L2 is connected to the node between the pair of mixer diodes 15 and 16, and the inductor L3 is connected to the IF port 13.

The mixer diodes 15 and 16 utilize nonlinear resistance to mix RF and LO signals, thereby converting frequencies.

Thus, an LO signal converted into a balanced signal by the balun 14 and an RF signal input from the RF port 12 through the high-pass filter 17 are mixed, so that a signal is output as an IF signal from the IF port 13 through the low-pass filter 18.

Figure 2:
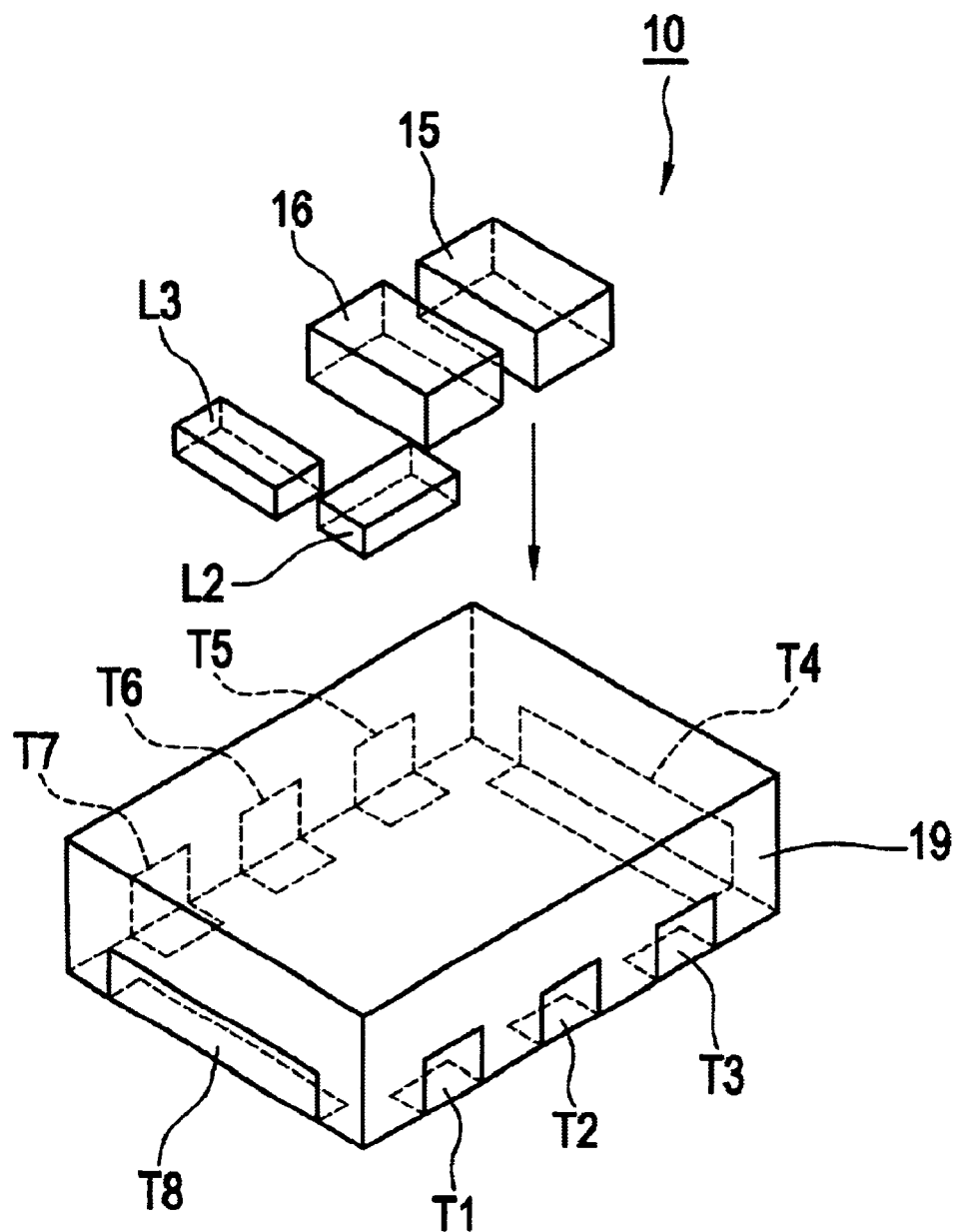
FIG. 2 is a partially exploded perspective view of the mixer of FIG. 1.
Figure 3A:
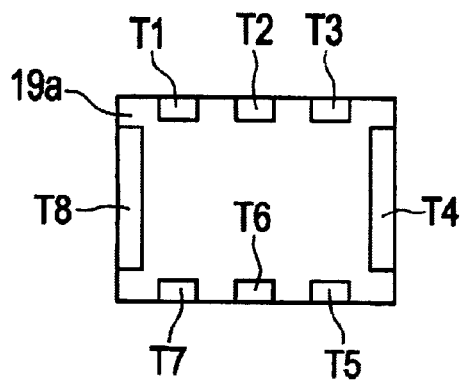
FIGS. 3A to 3F are views showing the obverse surfaces of first to sixth sheet layers, respectively, that constitute a ceramic multilayer substrate of the mixer shown in FIG. 2.
Figure 3B:
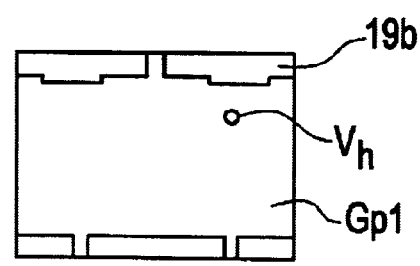
Figure 3C:
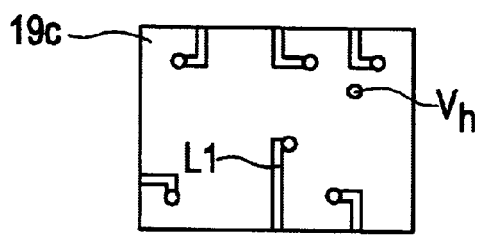
Figure 3D:
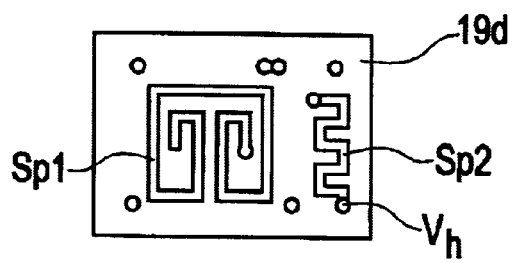
Figure 3E:
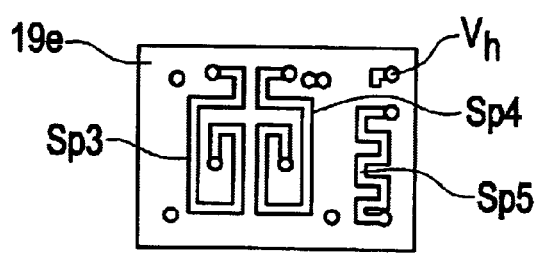
Figure 3F:
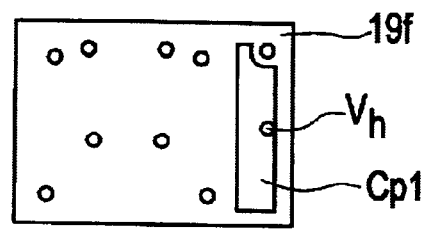

FIG. 2 is a partially exploded perspective view of the mixer shown in FIG. 1. The mixer 10 preferably includes a multilayer ceramic substrate 19. The multilayer ceramic substrate 19 includes strip line electrodes (not shown in FIG. 2) which define the balanced lines 14a and 14b and the unbalanced line 14c of the balun 14; strip line electrodes, capacitor electrodes, and ground electrodes (not shown in FIG. 2) which define the inductor L1 and the capacitors C1 and C2 of the high-pass filter 17; and a capacitor electrode and ground electrodes (not shown in FIG. 2) which define the capacitor C3 of the low-pass filter 18.

The mixer diodes 15 and 16 and the inductors L2 and L3 of the low-pass filter 18 are mounted on the upper surface of the multilayer ceramic substrate 19. External terminals T1 to T8 are also arranged to extend from the side surfaces to the bottom surface of the multilayer ceramic substrate 19.

In this case, the external terminals T1, T3, and T6 respectively function as the IF port 13, the RF port 12, and the LO port 11, and the external terminals T2, T4, T5, T7, and T8 each function as ground. In this arrangement, the external terminal T2 which functions as ground is provided between the external terminal T1, which functions as the IF port 13, and the external terminal T3, which functions as the RF port 12. The external terminals T4 and T5 which function as ground are provided between the external terminal T3, which functions as the RF port 12, and the external terminal T6, which functions as the LO port 11. Further, the external terminals T7 and T8 which function as ground are provided between the external terminal T6, which functions as the LO port 11, and the external terminal T1, which functions as the IF port 13.

Figure 4A:
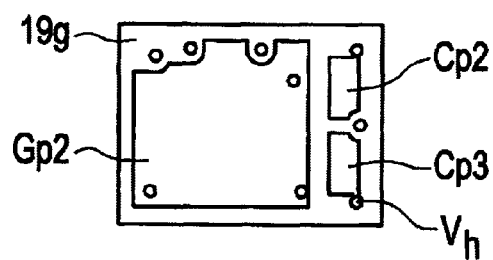
FIGS. 4A to 4D are views showing the obverse surfaces of seventh to tenth sheet layers, respectively, that constitute the ceramic multilayer substrate of the mixer shown in FIG. 2.
Figure 4B:
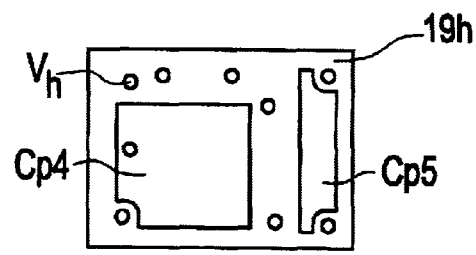
Figure 4C:
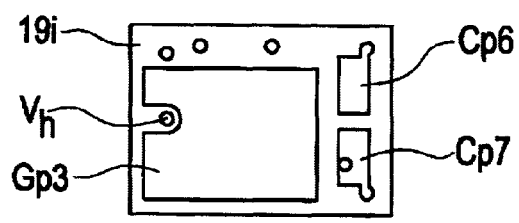
Figure 4D:
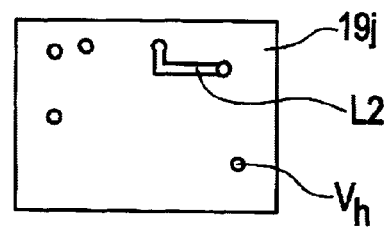
Figure 4E:
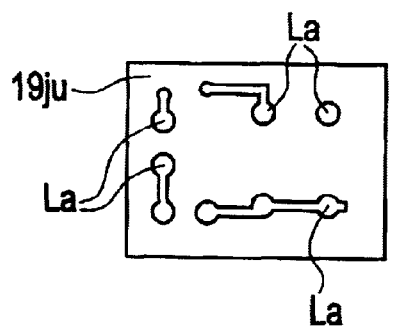
FIG. 4E is a reverse surface of the tenth sheet layer shown in FIG. 4D.

FIGS. 3A to 3F and FIGS. 4A to 4D are views showing the obverse surfaces of first to tenth sheet layers 19a to 19j, respectively, that constitute the multilayer ceramic substrate of the mixer shown in FIG. 2, and FIG. 4E is a view showing the reverse surface of the sheet layer shown in FIG. 4D. The first to tenth sheet layers 19a to 19j, which may be made of a ceramic including barium oxide, aluminium oxide, and silica as the main components, are sequentially stacked from above. The resulting structure is then fired at about 1,000° C. or below and is turned upside down to complete the multilayer ceramic substrate 19. Thus, the tenth sheet layer 19j becomes the top layer of the multilayer ceramic substrate 19 and the first sheet layer 19a becomes the bottom layer of the multilayer ceramic substrate 19.

The external terminals T1 to T8 are disposed on the obverse surface of the first sheet layer 19a. Ground electrodes Gp1 to Gp3 are disposed on the second, seventh, and ninth sheet layers 19b, 19g, and 19i, respectively.

In addition, strip line electrodes Sp1 and Sp2 are disposed on the obverse surface of the fourth sheet layer 19d, and strip line electrodes Sp3 to Sp5 are disposed on the obverse surface of the fifth sheet layer 19e. A capacitor electrode Cp1 is disposed on the obverse surface of the sixth layer 19f, capacitor electrodes Cp1 and Cp2 are disposed on the seventh layer 19g, capacitor electrodes Cp4 and Cp5 are disposed on the eighth layer 19h, and the capacitor electrodes Cp6 and Cp7 are disposed on the ninth layer 19i.

Leads L1 and L2 are disposed on the obverse surfaces of the third and tenth sheet layers 19c and 19j, respectively. Mounting electrodes La for mounting the mixer diodes 15 and 16 and inductors L2 and L3 of the low-pass filter 18 are disposed on the reverse surface (19*ju* in FIG. 4E) of the tenth sheet layer. Further, with respect to the second to tenth sheet layers 19*b* to 19*j*, a plurality of via-hole electrodes Vh is formed through each of the sheet layers 19*b* to 19*j*.

The balanced lines 14*a* and 14*b* of the balun 14 are defined by the strip line electrodes Sp3 and Sp4, respectively, and the unbalanced line 14*c* is defined by the strip line electrode Sp1. The inductor L1 of the high-pass filter 17 is defined by the strip line electrode Sp2 and Sp5.

The capacitor C1 of the high-pass filter 17 is defined by the capacitor electrodes Cp1, Cp3, Cp5, and Cp7, while the capacitor C2 is defined by the capacitor electrodes Cp1, Cp2, Cp5, and Cp6. Further, the capacitor C3 of the low-pass filter 18 is defined by the capacitor electrode Cp4 and the ground electrodes Gp2 and Gp3.

The via-hole electrodes Vh, which pass through the sheet layers 19*b* to 19*j*, provide connections to the individual electrodes and leads.

In the structure described above, the strip line electrodes Sp3, Sp4, and Sp1, which define the balanced lines 14*a* and 14*b* and the unbalanced line 14*c* of the balun 14, are located in the lower section of the multilayer ceramic substrate 19 with respect to the stacking direction thereof. In addition, the capacitor electrode Cp4, which defines the capacitor C3 of the low-pass filter 18, is located in the upper section of the multilayer ceramic substrate 19 with respect to the stacking direction, with a ground electrode Gp2 being provided between the capacitor electrode Cp4 and the strip line electrodes Sp3, Sp4, and Sp1.

Figure 5:
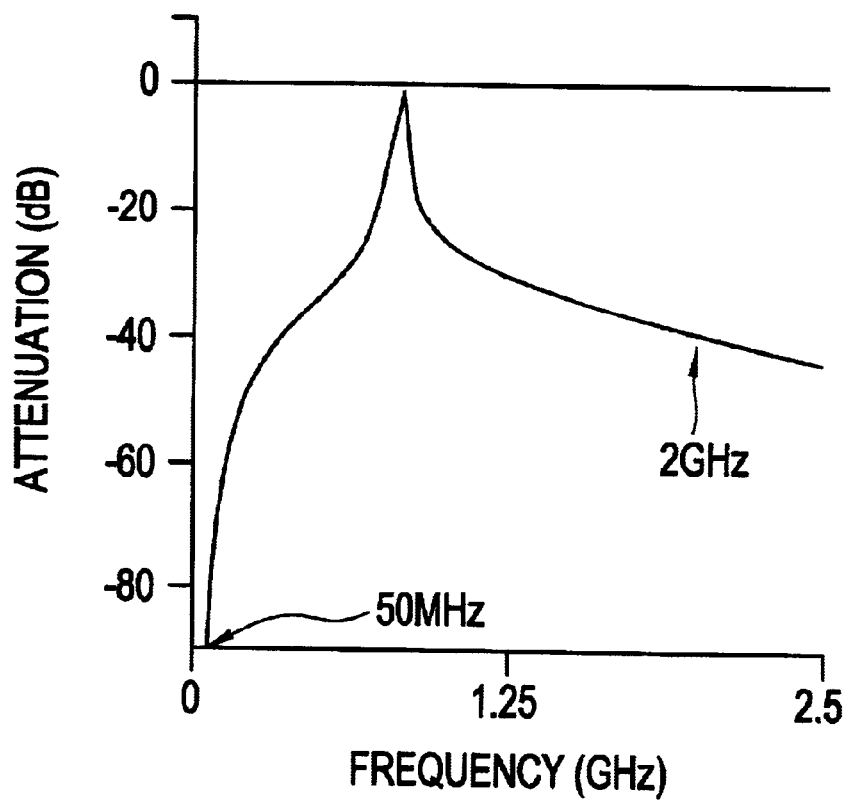
FIG. 5 shows a frequency characteristic of the mixer of FIG. 1.

FIG. 5 shows the frequency characteristic of the mixer 10, that is, the isolation between the RF port 12 and the IF port 13 thereof.

Specifically, FIG. 5 shows that the attenuation between the RF port 12 and the IF port 13 at an IF signal frequency of 50 MHz is about −90 dB and the attenuation therebetween at an RF signal frequency of 2 GHz is about −40 dB. This indicates that the RF port 12 and the IF port 13 are electrically isolated such that mutual interference of their respective frequencies is reliably prevented.

According to the mixer of the present preferred embodiment described above, the external terminals which function as the LO port, RF port, and IF port are arranged to extend from the side surfaces to the bottom surface of the multilayer ceramic substrate, with external electrodes that function as ground being provided therebetween. Thus, interference among the external terminals which define the LO port, RF port, and IF port is prevented, so that the loss in the mixer is minimized.

In addition, the balun, mixer diodes, high-pass filter, and low-pass filter which constitute the mixer are integrated into the multilayer ceramic substrate that includes a plurality of sheet layers preferably made of ceramic and stacked on each other, thus allowing miniaturization of the mixer.

Furthermore, the balanced and the unbalanced lines that constitute the balun are provided in the lower section of the multilayer ceramic substrate with respect to the stacking direction. Thus, the distance of the balanced and the unbalanced lines from ground is reduced, so that parasitic inductance in the ground plane is minimized. Consequently, the phase difference between the balanced lines and the unbalanced line is much closer to a more ideal value.

In addition, the capacitor which defines the low-pass filter is located in the upper section of the multilayer ceramic substrate with respect to the stacking direction thereof, with the ground electrode being provided between the capacitor and the strip line electrodes that constitute the balanced and unbalanced lines of the balun. Thus, the capacitor is arranged so as to be spaced away from ground provided in the lower section of the ceramic multilayer substrate. As a result, stray capacitance is minimized and thus the isolation is greatly improved.

Figure 6:
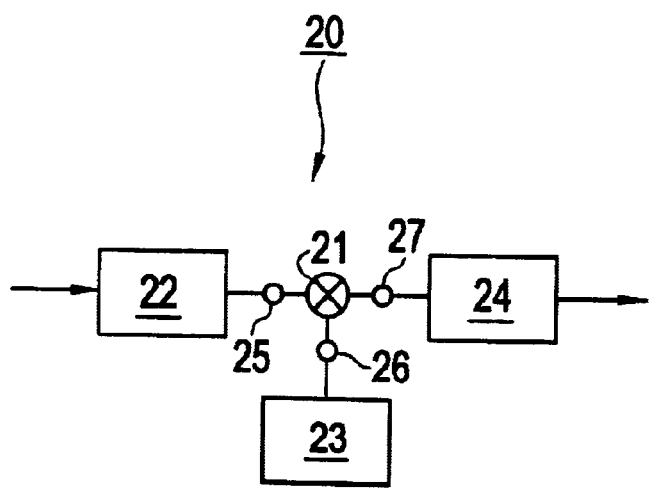
FIG. 6 is a block diagram of the basic configuration of a converter according to another preferred embodiment of the present invention.
Figure 7:
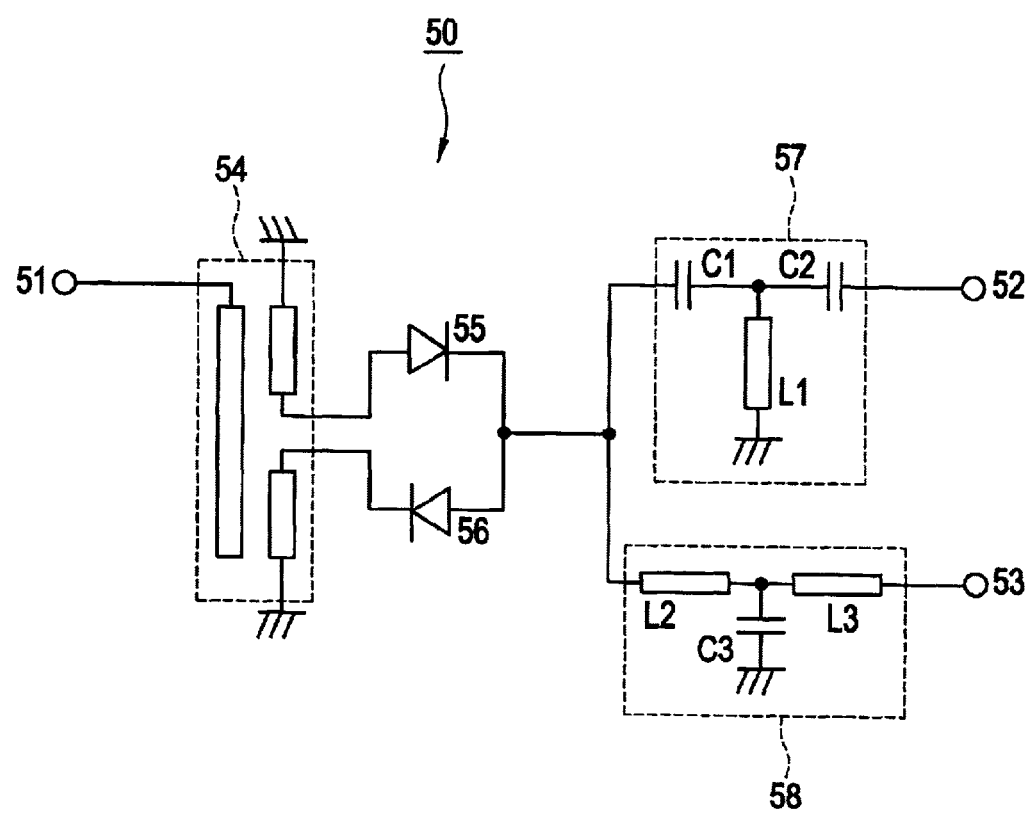
FIG. 7 is a circuit diagram of a mixer of related art.

FIG. 6 is a block diagram of the basic configuration of a converter according to another preferred embodiment of the present invention. A receiving converter 20 preferably includes a mixer 21, an RF amplifying unit 22, a PLL oscillation unit 23, and an intermediate frequency amplifying unit 24.

An RF port 25 of the mixer 21 is connected to the output of the RF amplifying unit 22, an LO port 26 is connected to the output of the PLL oscillation unit 23, and an IF port 27 is connected to the intermediate frequency amplifying unit 24.

In this preferred embodiment, the mixer 10 according the preferred embodiment described above is preferably used for the mixer 21 in such a receiving converter.

Since the receiving converter described above has a mixer that minimizes loss, it also minimizes loss in the converter.

While the mixer of preferred embodiments has been described in connection with the case in which two diodes are mounted on the multilayer ceramic substrate, the use of a semiconductor device in which two diodes are packaged together can also provide similar advantages. In addition, while the description has been given of the case in which the substrate is preferably made of a ceramic material, the material of the substrate is not limited thereto.

While the converter of preferred embodiments has been illustrated in connection with the exemplary receiving converter, a transmitting converter can also be used to provide similar advantages.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A mixer comprising:
   a balun including two balanced lines each having a first end that is short-circuited and a second end that defines a balanced terminal, and an unbalanced line having a first end that is free and a second end that defines an unbalanced terminal;
   a pair of mixer diodes connected to respective ones of the balanced terminals;
   an LO port connected to the unbalanced terminal;
   a high-pass filter;
   an RF port connected to a node between said mixer diodes through said high-pass filter;
   a low-pass filter; and
   an IF port connected to the node between said mixer diodes through said low-pass filter;
   wherein said balun, said pair of mixer diodes, said high-pass filter, and said low-pass filter are integrated into a multilayer substrate that includes a plurality of sheet layers stacked on each other; and
   the multilayer substrate has first external terminals that respectively define said LO port, said RF port, and said IF port at the side surfaces thereof, and has second external terminals that define a ground, at least one of the second external terminals being arranged between two of the first external terminals.

2. A mixer according to claim 1, wherein each of the balanced lines and the unbalanced line includes strip line electrodes, and is arranged in the lower section of the multilayer substrate with respect to the stacking direction of the multilayer substrate.

3. A mixer according to claim 2, wherein at least one of said high-pass filter and said low-pass filter includes at least one capacitor, each capacitor including at least one capacitor electrode, and is located in the upper section of the multilayer substrate with respect to the stacking direction thereof, a ground electrode being provided between said at least one capacitor electrode and the strip line electrodes.

4. A mixer according to claim 1, wherein the mixer is a single balanced mixer.

5. A mixer according to claim 1, wherein the high-pass filter blocks LO and IF signals and passes only an RF signal.

6. A mixer according to claim 1, wherein the low-pass filter blocks LO and RF signals and passes only an IF signal.

7. A mixer according to claim 1, wherein the high-pass filter includes an inductor and at least two capacitors.

8. A mixer according to claim 1, wherein the low-pass filter includes at least two inductors and a capacitor.

9. A mixer according to claim 1, wherein the sheet layers of the multilayer substrate are made of ceramic material.

10. A mixer according to claim 1, wherein the multilayer substrate includes strip line electrodes which define the balanced lines and the unbalanced line of the balun, strip line electrodes, capacitor electrodes, and ground electrodes which define the high-pass filter, and a capacitor electrode and ground electrodes which define the low-pass filter.

11. A mixer according to claim 1, wherein the external terminals are arranged to extend from the side surfaces to the bottom surface of the multilayer ceramic substrate.

12. A mixer according to claim 1, wherein the low-pass filter is located in the upper section of the multilayer substrate.

13. A mixer according to claim 1, wherein the balanced and unbalanced lines of the balun include a ground electrode, a capacitor and strip line electrodes, wherein the ground electrode is provided between the capacitor and the strip line electrodes.

14. A converter comprising:

a mixer according to claim 1;

an RF amplifying unit connected to said RF port of said mixer;

a PLL oscillation unit connected to said LO port of said mixer; and an intermediate frequency amplifying unit connected to said IF port of said mixer.

15. A converter comprising:

a mixer according to claim 2;

an RF amplifying unit connected to said RF port of said mixer;

a PLL oscillation unit connected to said LO port of said mixer; and an intermediate frequency amplifying unit connected to said IF port of said mixer.

16. A converter comprising:

a mixer according to claim 3;

an RF amplifying unit connected to said RF port of said mixer;

a PLL oscillation unit connected to said LO port of said mixer; and an intermediate frequency amplifying unit connected to said IF port of said mixer.

17. A converter comprising:

a mixer according to claim 4;

an RF amplifying unit connected to said RF port of said mixer;

a PLL oscillation unit connected to said LO port of said mixer; and an intermediate frequency amplifying unit connected to said IF port of said mixer.

* * * * *